(12) United States Patent
Park et al.

(10) Patent No.: US 11,437,563 B2
(45) Date of Patent: Sep. 6, 2022

(54) ACOUSTIC WAVE DEVICE AND METHOD OF MANUFACTURING THE SAME

(71) Applicant: Samsung Electro-Mechanics Co., Ltd., Suwon-si (KR)

(72) Inventors: Seung Wook Park, Suwon-si (KR); Jae Hyun Jung, Suwon-si (KR); Seong Hun Na, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 1138 days.

(21) Appl. No.: 15/972,499

(22) Filed: May 7, 2018

(65) Prior Publication Data

US 2019/0019939 A1    Jan. 17, 2019

(30) Foreign Application Priority Data

Jul. 17, 2017  (KR) .......................... 10-2017-0090196
Aug. 30, 2017  (KR) .......................... 10-2017-0110130

(51) Int. Cl.
*H03H 9/64* (2006.01)
*H01L 41/09* (2006.01)
(Continued)

(52) U.S. Cl.
CPC .......... *H01L 41/09* (2013.01); *H01L 41/0533* (2013.01); *H01L 41/23* (2013.01);
(Continued)

(58) Field of Classification Search
CPC .. H03H 9/0557; H03H 9/1014; H03H 9/1071; H03H 9/64; H01L 41/09; H01L 41/0533
See application file for complete search history.

(56) References Cited

U.S. PATENT DOCUMENTS

2004/0067650 A1* 4/2004 Dache .................. B81B 7/0077
                                                       438/689
2005/0073375 A1* 4/2005 Sul ....................... H03H 9/0571
                                                       333/133
(Continued)

FOREIGN PATENT DOCUMENTS

CN    103636124 A    3/2014
CN    106664076 A    5/2017
(Continued)

OTHER PUBLICATIONS

Chinese Office Action dated Jan. 4, 2022, in counterpart Chinese Patent Application No. 201810784431 .X (11 pages in English and 7 pages in Chinese).

(Continued)

*Primary Examiner* — J. San Martin
(74) *Attorney, Agent, or Firm* — NSIP Law

(57) ABSTRACT

An acoustic wave device includes an acoustic wave generator, a support portion, a protective member, and at least one element embedded in the protective member. The acoustic wave generator is disposed on a surface of a substrate. The support portion is disposed on the substrate along a circumference of the acoustic wave generator. The protective member is coupled to the support portion and disposed to be spaced apart from the acoustic wave generator by an interval.

15 Claims, 8 Drawing Sheets

(51) Int. Cl.
  *H01L 41/23* (2013.01)
  *H01L 41/053* (2006.01)
  *H03H 9/05* (2006.01)
  *H03H 9/10* (2006.01)

(52) U.S. Cl.
  CPC ........ *H03H 9/0557* (2013.01); *H03H 9/1014* (2013.01); *H03H 9/1071* (2013.01); *H03H 9/64* (2013.01)

(56) References Cited

U.S. PATENT DOCUMENTS

| | | |
|---|---|---|
| 2006/0061435 A1 | 3/2006 | Sul |
| 2010/0225202 A1 | 9/2010 | Fukano et al. |
| 2012/0326810 A1* | 12/2012 | Omura ............... H03H 9/0576 333/195 |
| 2013/0134831 A1 | 5/2013 | Yamashita |
| 2013/0321102 A1* | 12/2013 | Iwaki ................ H03H 9/0576 333/193 |
| 2014/0118084 A1 | 5/2014 | Takemura |
| 2017/0077900 A1 | 3/2017 | Park et al. |
| 2017/0155376 A1 | 6/2017 | Yamaguchi |
| 2017/0163243 A1 | 6/2017 | Bulger |
| 2017/0250669 A1 | 8/2017 | Kuroyanagi et al. |
| 2017/0346463 A1 | 11/2017 | Hatakeyama et al. |
| 2018/0013055 A1* | 1/2018 | Metzger ............... H01L 41/23 |
| 2019/0074571 A1* | 3/2019 | Dekosky ............... H01P 1/30 |
| 2019/0081612 A1* | 3/2019 | Tang ...................... H03H 9/542 |
| 2020/0219861 A1* | 7/2020 | Kamgaing ........... H03H 9/0561 |
| 2020/0235716 A1* | 7/2020 | Eid ...................... H03H 9/0557 |
| 2020/0259478 A1* | 8/2020 | Dogiamis ............ H03H 9/0542 |
| 2021/0035929 A1* | 2/2021 | Park ...................... H01L 23/66 |
| 2021/0351750 A1* | 11/2021 | Kim ....................... H01L 23/34 |

FOREIGN PATENT DOCUMENTS

| | | | |
|---|---|---|---|
| CN | 107134986 A | 9/2017 | |
| JP | 5514898 B2 | 6/2014 | |
| JP | 2016-36182 A | 3/2016 | |
| JP | 5873311 B2 | 3/2016 | |
| JP | 2017-212628 A | 11/2017 | |
| KR | 10-2005-0000923 A | 1/2005 | |
| KR | 10-0649497 B1 | 11/2006 | |
| KR | 10-2017-0032149 A | 3/2017 | |
| KR | 20180028844 A * | 3/2018 | ............... H03H 9/17 |
| WO | WO 2007/055080 A1 | 5/2007 | |
| WO | WO 2008/105199 A1 | 9/2008 | |
| WO | WO-2016134803 A1 * | 9/2016 | ......... H01L 41/0533 |

OTHER PUBLICATIONS

Chinese Office Action dated Apr. 2, 2022, in counterpart Chinese Patent Application No. 201810784431 .X (15 pages in English, 9 pages in Chinese).

Korean Office Action dated Feb. 25, 2022, in counterpart Korean Patent Application No. 10-2017-0110130 (8 pages in English and 6 pages in Korean).

* cited by examiner

S001

S002

S003

S004

S005

ACOUSTIC WAVE DEVICE AND METHOD OF MANUFACTURING THE SAME

CROSS-REFERENCE TO RELATED APPLICATIONS APPLICATION(S)

This application claims the benefit under 35 USC 119(a) of Korean Patent Application Nos. 10-2017-0090196 filed on Jul. 17, 2017, and 10-2017-0110130 filed on Aug. 30, 2017, in the Korean Intellectual Property Office, the entire disclosures of which are incorporated herein by reference for all purposes.

BACKGROUND

1. Field

The present disclosure relates to an acoustic wave device and a method of manufacturing the same.

2. Description of Related Art

A band pass filter is a key component in a communications device that selects only a signal within a required frequency band, from among various frequency bands, to transmit and receive the selected signal.

Recently, an acoustic wave device has been widely used as such a band pass filter. In the acoustic wave device, a thin film element is formed as a filter by depositing a piezoelectric dielectric material on a silicon wafer, a semiconductor substrate, and resonates using its piezoelectric characteristics.

Examples of the acoustic wave device may include a surface acoustic wave (SAW) filter, a bulk acoustic wave (BAW) filter, and the like.

A plurality of acoustic wave devices may be mounted on a substrate and used as a module in applications that may include small and lightweight filters of mobile communications devices, chemical and biological devices, oscillators, acoustic resonance mass sensors, and the like.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic wave device includes an acoustic wave generator, a support portion, a protective member, and at least one element embedded in the protective member. The acoustic wave generator is disposed on a surface of a substrate. The support portion is disposed on the substrate along a circumference of the acoustic wave generator. The protective member is coupled to the support portion and disposed to be spaced apart from the acoustic wave generator by an interval.

The protective member may comprise a substrate covering an upper portion of the acoustic wave generator.

The protective member may include an insulating member, and the at least one element may include an inductor pattern embedded in the insulating member.

The acoustic wave device may further include a connection conductor disposed to penetrate through the support portion and the protective member. The inductor pattern may be electrically connected to the acoustic wave generator through the connection conductor.

The connection conductor may have one end connected to the substrate and another end coupled to a connection terminal.

The acoustic wave device may further include a plurality of connection terminals disposed on an outer surface of the protective member and electrically connecting the substrate and a main board to each other; and at least one supporting terminal disposed between the main board and the protective member to support the protective member.

The supporting terminal and the connection terminal may be formed of a same material, and the supporting terminal and the connection terminal may be coupled to the main board.

The supporting terminal may be a dummy terminal which is not electrically connected to the substrate.

The supporting terminal may be disposed in a region corresponding to a region in which the acoustic wave generator is formed.

The acoustic wave device may further include an airtight film disposed along surfaces of the protective member and the support portion to prevent moisture or foreign materials from entering the acoustic wave generator.

The airtight film may be formed of an inorganic insulating film or a thin film.

In another general aspect, a method of manufacturing an acoustic wave device includes: preparing a substrate having an acoustic wave generator formed on one surface thereof; disposing a support portion on the substrate along a circumference of the acoustic wave generator; and forming a protective member by embedding at least one element in an insulating member, and coupling the protective member to the support portion such that the protective member is spaced apart from the acoustic wave generator by an interval.

The embedding of the at least one element in the insulating member may include disposing a first insulating layer of the insulating member on a carrier substrate, forming the at least one element in a pattern on the first insulating layer, and disposing a second insulating layer of the insulating member on the at least one element; and the coupling the protective member to the support portion may include transferring a structure formed on the carrier substrate onto the substrate.

The forming of the protective member may include: disposing a first insulating layer on the support portion; forming an inductor pattern on the insulating layer; and forming a second insulating layer on the inductor pattern.

The method may further include forming a connection terminal and a supporting terminal on the protective member.

The method may further include forming an airtight film along surfaces of the protective member and the support portion.

In another general aspect, an acoustic wave device includes an acoustic wave generator, a support portion, and insulating layers. The acoustic wave generator is disposed on a surface of a substrate. The support portion is disposed on the substrate along a circumference of the acoustic wave generator. The insulating layers are coupled to the support portion, and disposed to be spaced apart from the acoustic wave generator by a predetermined interval. Elements are embedded in each of the insulating layers.

At least one of the elements in the insulating layers may include an inductor pattern.

The acoustic wave device may further include a connection conductor penetrating through the support portion and the insulating layers. The inductor pattern may be electrically connected to the acoustic wave generator through the connection conductor.

The connection conductor may have one end connected to the substrate and another end coupled to a connection terminal.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
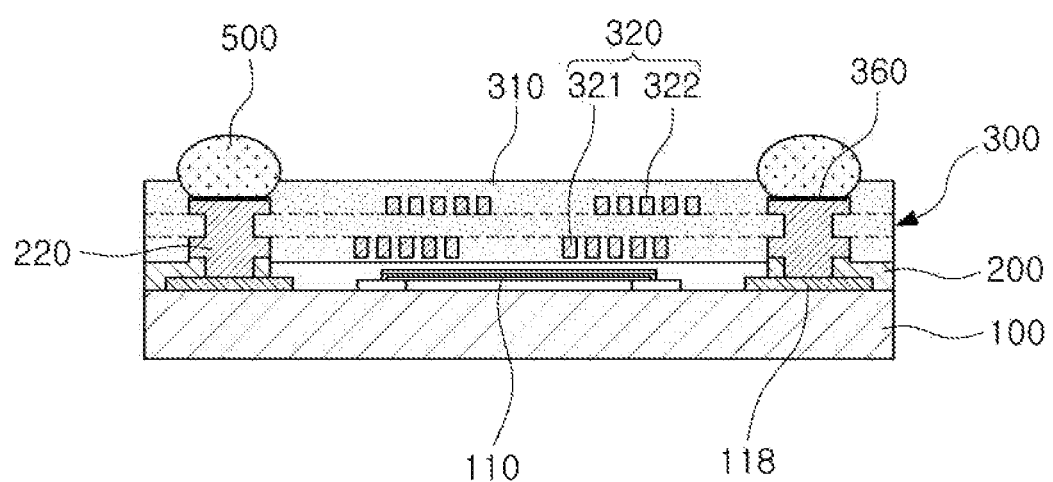
FIG. 1 is a cross-sectional view schematically illustrating an example of an acoustic wave device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

FIG. 1 is a cross-sectional view schematically illustrating an example of an acoustic wave device.

Referring to FIG. 1, an acoustic wave device includes a substrate 100, a support portion 200, and a protective member 300. Here, the acoustic wave device includes a filter element that passes approved frequency bands, such as a surface acoustic wave filter, a bulk acoustic wave filter, a duplexer, and the like.

In an example in which the acoustic wave device is a SAW filter, the substrate 100 may be provided as a piezoelectric substrate, and in an example in which the acoustic wave device is the BAW filter, a Si substrate may be used. For example, the substrate 100 may be formed of single crystal such as $LiTaO_3$, $LiNbO_3$, $Li_2B_4O_7$, $SiO_2$, silicon, or the like. Together with the materials described above, lead zirconium titanate (PZT) based polycrystal or a zinc oxide (ZnO) thin film may be used.

However, the substrate 100 used for the acoustic wave device is not limited to the above-mentioned examples, and may be substituted with various substrates which are widely used in the art.

An acoustic wave generator 110 is formed on a surface of the substrate 100. The acoustic wave generator 110 may include an interdigital transducer (IDT) electrode or a piezoelectric thin film resonator that converts an electrical signal into a mechanical signal or converts the mechanical signal into the electrical signal.

For example, in a case in which the acoustic wave device is used as the surface acoustic wave (SAW) filter, the acoustic wave generator 110 may be provided as a metal electrode. In an example in which the acoustic wave device is used as the bulk acoustic wave (BAW) filter, the acoustic wave generator 110 may be formed in a form of structure in which a piezoelectric element and an electrode are stacked.

The acoustic wave generator 110 may be formed as a piezoelectric thin film resonator in which a piezoelectric thin film is stacked. Therefore, the acoustic wave generator 110 may form a resonating part by upwardly stacking a lower electrode, a piezoelectric layer, and an upper electrode in this order.

However, the configuration of the present disclosure is not limited thereto. In a case in which the acoustic wave generator 110 is the IDT electrode, the acoustic wave generator 110 may be formed of aluminum or copper, and may be formed in a structure in which a plurality of electrodes are alternately intersected in a comb form. In this case, the acoustic wave generator 110 may be formed by forming a metal layer on the substrate 100 and machining the metal layer into a predetermined electrode form by a photolithography method.

In addition, the support portion 200 and an electrode member 118 are disposed on a surface of the substrate 100. The support portion 200 may be formed to cover the electrode member 118 connected to the acoustic wave generator 110. However, the support portion 200 is not limited thereto, but may also be disposed so that a portion or all of the electrode member 118 is exposed to the outside.

The support portion 200 may be continuously formed to surround a circumference of the acoustic wave generator 110. However, the support portion 200 is not limited thereto, and a plurality of support portions may also be disposed to be spaced apart from each other along the circumference of the acoustic wave generator 110.

The support portion 200 may be formed of an insulating material such as a resin or polymer. However, the material of the support portion 200 is not limited thereto and the support portion 200 may also be formed of a metal material, as needed.

In addition, the support portion 200 may protrude on a surface of the substrate 100 by a predetermined height. In this case, the protruding height of the support portion 200 may be greater than a height of the acoustic wave generator 110. Accordingly, a gap may be formed between the protective member 300 which is seated on the support portion 200 and the acoustic wave generator 110.

However, a structure of the support portion 200 according to the present example is not limited to the above-mentioned configuration, and may be variously changed as long as it is a structure in which the gap is formed between the protective member 300 and the acoustic wave generator 110.

At least one connection conductor 220 is disposed in the support portion 200. The connection conductor 220 may have conductivity and may be disposed to penetrate through the support portion 200.

The connection conductor 220 may penetrate through the protective member 300, to be described below, and may be electrically connected to the electrode member 118 of the substrate 100.

The electrode member 118, which is a portion to which the connection conductor 220 is bonded, may be electrically connected to the acoustic wave generator 110 through a wiring pattern (not shown) formed in the substrate 100.

The protective member 300 may protect the acoustic wave generator 110 from an external environment. The protective member 300 may be formed to entirely cover an upper portion of the acoustic wave generator 110.

The protective member 300 may be formed as a flat substrate, and may be seated on the support portion 200 to abut all or a portion of an upper surface of the support portion 200.

The protective member 300 may be disposed to be spaced apart from the acoustic wave generator 110 by the support portion 200. Therefore, an empty space or void may be formed between the acoustic wave generator 110 and the protective member 300 by the support portion 200, and the empty space may be used as a resonator-accommodating space of the acoustic wave generator 110 when the acoustic wave device is driven. As a result, when the acoustic wave generator 110 resonates, the resonating acoustic wave generator 110 is accommodated within the resonator-accommodating space and does not contact the protective member 300.

In addition, the protective member 300 according to the present example may include an insulating member 310 in which a plurality of insulating layers are stacked, and at least one element embedded in the insulating member 310. According to the present example, the element embedded in the insulating member 310 may be an inductor 320 (hereinafter, referred to as an inductor pattern) formed by a wiring pattern.

The insulating member 310 serves to perform an interlayer insulation and protect the inductor pattern 320. The insulating member 310 may include a thermosetting resin such as epoxy, a thermoplastic resin such as polyimide, solder resist, a photo-curable resin, or the like. In addition, in order to provide rigidity, prepreg having a reinforcement material such as glass fiber or inorganic filler impregnated in the above-mentioned resins may also be used.

In addition, in order to adjust the inductance of the inductor pattern 320, a magnetic material including a magnetic substance may also be used as the insulating member 310.

The inductor pattern 320 may be disposed in the insulating member 310. The present example illustrates an example in which the inductor pattern 320 is formed in a spiral shape, but the inductor pattern 320 may be formed in various shapes such as a helical shape, a meander shape, and the like, as long as it provides a needed inductance.

In addition, a plurality of inductor patterns 320 may be formed, and in this case, the plurality of inductor patterns may be connected in parallel to or in series with each other. According to the present example, the inductor pattern 320 may include a first inductor pattern 321 disposed adjacent to the substrate 100, and a second inductor pattern 322 disposed on the outside of the first inductor pattern 321.

The first inductor pattern 321 and the second inductor pattern 322 may be connected to each other to operate as a single inductor. However, the first inductor pattern 321 and the second inductor pattern 322 are not limited thereto, and may also operate independently from each other.

Both ends of the inductor pattern 320 may be connected to the connection conductor 220.

The connection conductor 220, which is a conductive member disposed to penetrate through the support portion 200 and the insulating member 310, may have one end connected to the substrate 100 and the other end coupled to a connection terminal 500.

Thus, the connection conductor 220 may electrically connect the connection terminal 500 and the acoustic wave generator 110 to each other. In addition, the inductor pattern 320 may be electrically connected to the acoustic wave generator 110 or the connection terminal 500 through the connection conductor 220.

The connection conductor 220 may be formed by filling a through hole penetrating through the protective member 300 and the support portion 200 with a conductive material or applying the conductive material onto an inner surface of the hole.

The conductive material forming the connection conductor 220 may be copper (Cu), silver (Ag), gold (Au), nickel (Ni), platinum (Pt), lead (Pd), or an alloy thereof, but is not limited thereto.

The connection terminal 500 may be disposed on an outer surface of the protective member 300, and may be electrically connected to the acoustic wave generator 110 through the connection conductor 220.

The connection terminal 500 may electrically and physically connect a main board (or a package board) on which the acoustic wave device is mounted and the acoustic wave device to each other.

The connection terminal 500 may be formed in a form of a solder ball or a solder bump, but is not limited thereto.

Next, a method of manufacturing the acoustic wave device illustrated in FIG. 1 will be described with reference to FIGS. 2 through 5.

Figure 2:
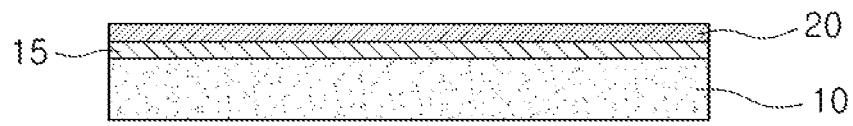
FIGS. 2 through 5 are views schematically illustrating an example of a method of manufacturing an acoustic wave device.
Figure 2:
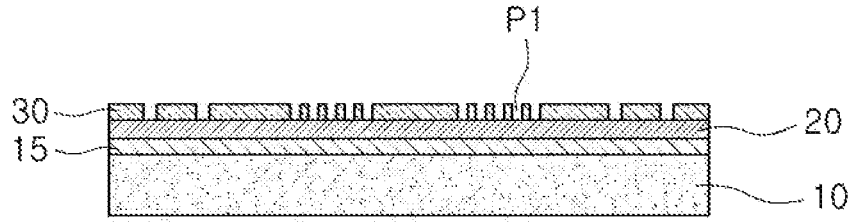
Figure 2:
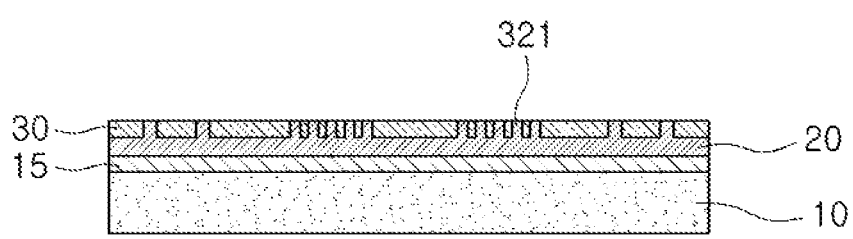
Figure 2:
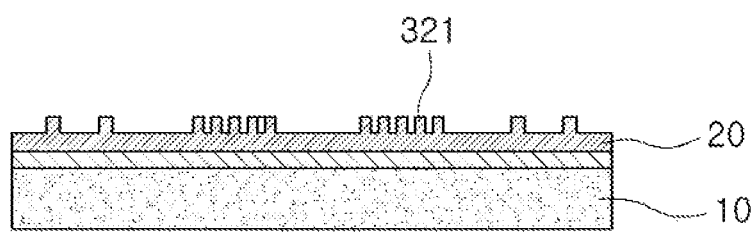
Figure 2:
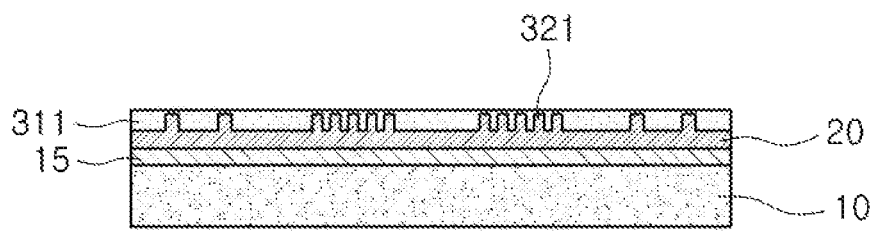
Figure 2:
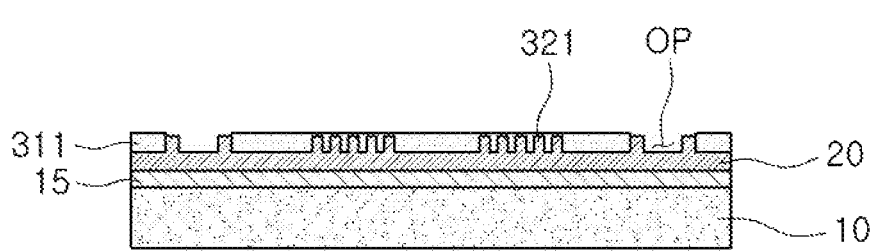

First, as illustrated in FIG. 2, a metal layer 20 is formed on a carrier substrate 10 (S01). Here, the metal layer 20 may be formed of copper (Cu). In addition, the metal layer 20 may be disposed on the carrier substrate 10 through a bonding member 15 such as an adhesive tape.

Next, after a first mask layer 30 is formed on the metal layer 20, the first mask layer 30 may be partially etched to form a first pattern P1 for forming a first inductor pattern 321 (S02). The first pattern P1 may be formed in a form penetrating through the first mask layer 30.

The first mask layer 30 may be formed of a dry film photoresist (DFR) or a photoresist (PR), but is not limited thereto.

In addition, as the first pattern P1 is formed on the first mask layer 30, a portion of the metal layer 20 may be externally exposed through the pattern P1.

Next, the first inductor pattern 321 may be formed by filling a conductive material in the first pattern P1 of the first mask layer 30 (S03). The present operation may be performed by a plating process or a silk screen method.

Next, the first mask layer 30 may be removed (S04). Thereby, only the first inductor pattern 321 remains on the metal layer 20.

Next, a first insulating layer 311 may be stacked on the metal layer 20 (S05). As described above, a material of the first insulating layer 311 may be a thermosetting resin such as epoxy, a thermoplastic resin such as polyimide, solder resist, a photo-curable resin, or the like. In addition, in order to provide rigidity, prepreg having a reinforcement material such as glass fiber or inorganic filler impregnated in the above-mentioned resins may also be used.

In addition, in order to adjust inductance of the inductor pattern 320, the first insulating layer 311 or other insulating layers to be described below may also be formed using a magnetic material including a magnetic substance.

According to the present example, the first insulating layer 311 may fully embed the first inductor pattern 321. However, embedding of the first inductor pattern in the first insulating layer 311 is not limited thereto, and may be variously modified. For example, the first insulating layer 311 may be formed so that a portion of the first inductor pattern 321 is exposed externally of the first insulating layer 311.

Next, an opening OP is formed in the first insulating layer 311 (S06). The opening OP may be formed in a form fully penetrating through the first insulating layer 311. As a result, the metal layer 20 is externally exposed through the opening OP. The opening OP may be later used to form the connection conductor 220.

Meanwhile, referring to the drawings, the opening OP may be formed in the conductor pattern formed together with the first inductor pattern 321 in the present example. However, the opening OP is not limited thereto, and may also be formed in a region in which there is no conductor pattern.

Figure 3:
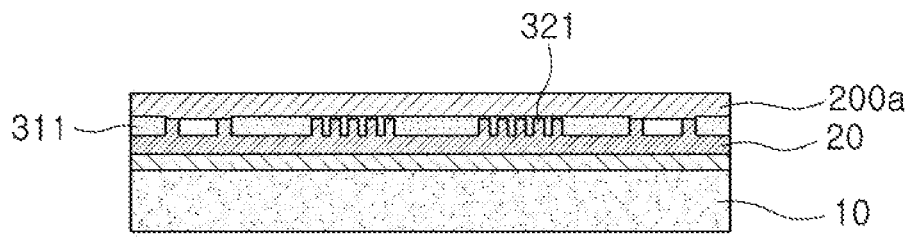
Figure 3:
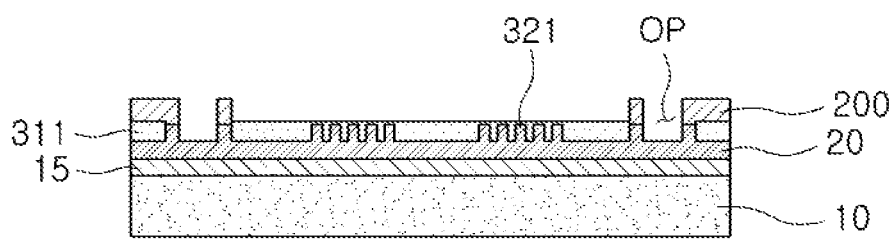
Figure 3:
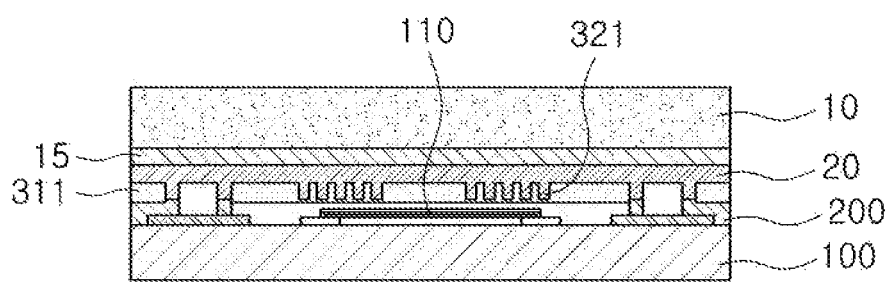
Figure 3:
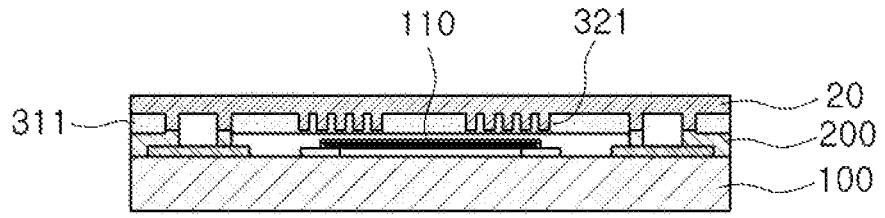
Figure 3:
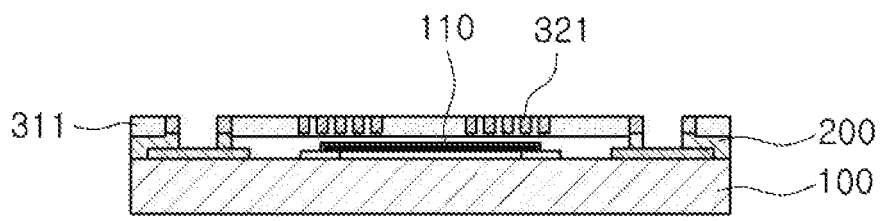

Next, as illustrated in FIG. 3, a supporting layer 200a is formed on the first insulating layer 311. The supporting layer 200a is formed to cover the entirety of the first insulating layer 311, but may also be formed to partially cover the first insulating layer 311 as needed.

The supporting layer 200a may be formed later as the support portion 200. Therefore, the supporting layer 200a may be formed of an insulating material such as a resin or polymer. However, the material of the supporting layer 200a is not limited thereto and the supporting layer 200a may also be formed of a metal material, as needed.

Next, the support portion 200 may be formed by removing an unnecessary portion of the supporting layer 200a (S08). During this operation, the opening OP described above may be opened by partially removing an inner portion of the support portion 200.

Next, after the substrate 100 on which the acoustic wave generator 110 is formed is prepared, a structure formed on the carrier substrate 10 may be transferred to the substrate 100 (S09). In this case, the structure may be transferred so that the support portion 200 is in contact with the substrate 100.

If the transfer is completed, the carrier substrate 10 may be removed (S10). As a result, the metal layer 20 may be externally exposed. In this operation, the adhesive member 15 may also be removed together with the carrier substrate 10.

Next, the metal layer 20 may be removed (S11). As a result, the first inductor pattern 321 may be externally exposed. The metal layer 20 may be removed by an etching method, but is not limited thereto.

Figure 4:
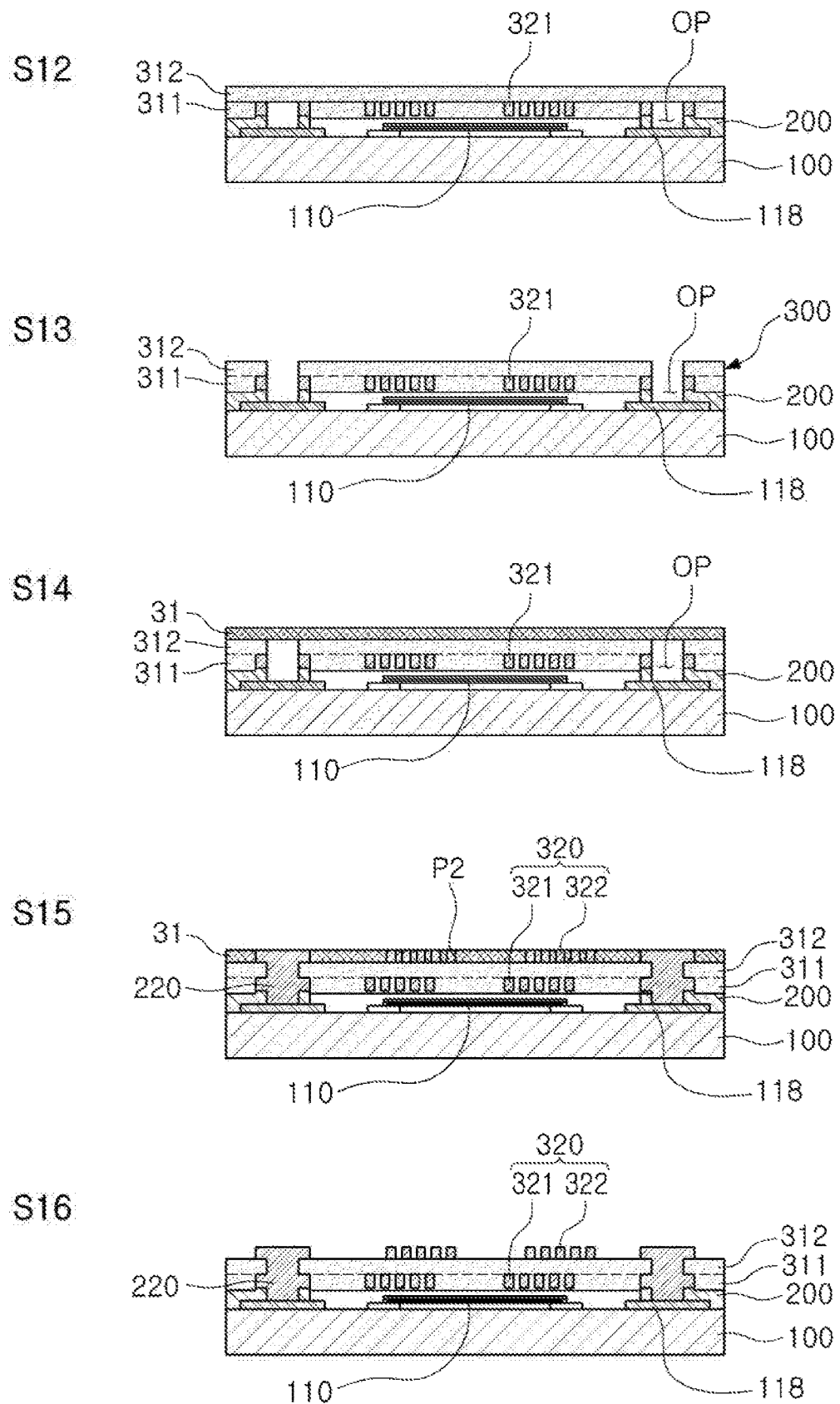

Next, as illustrated in FIG. 4, a second insulating layer 312 may be stacked on the first insulating layer 311 and the first inductor pattern 321 (S12). The second insulating layer 312, stacked in the present operation, may be formed of the same material as the first insulating layer 311, but may also be formed of a different material as needed.

Next, the opening OP may be opened (S13) by removing a portion of the second insulating layer 312, and a second mask layer 31 may be then disposed on the second insulating layer 312 (S14). The second mask layer 31 in the present operation may be formed of the same material (e.g., DFR) as the first mask layer 30 described above, but is not limited thereto.

Next, the second mask layer 31 may be patterned to form a second pattern P2 and open the opening OP. In addition, the second inductor pattern 322 and the connection conductor 220 may be formed by filling a conductive material in the second pattern P2 and the opening OP (S15). The present operation may be performed by a plating process or a silk screen method, but is not limited thereto.

Next, the mask layer 31 may be removed (S16). As a result, a portion of the second inductor pattern 322 and the connection conductor 220 may be externally exposed.

Figure 5:
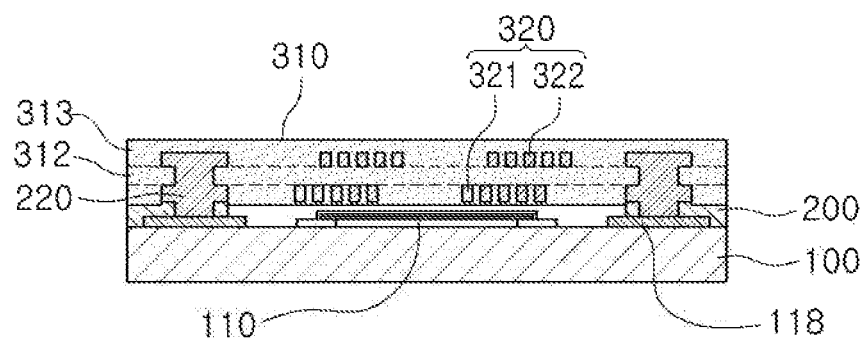
Figure 5:
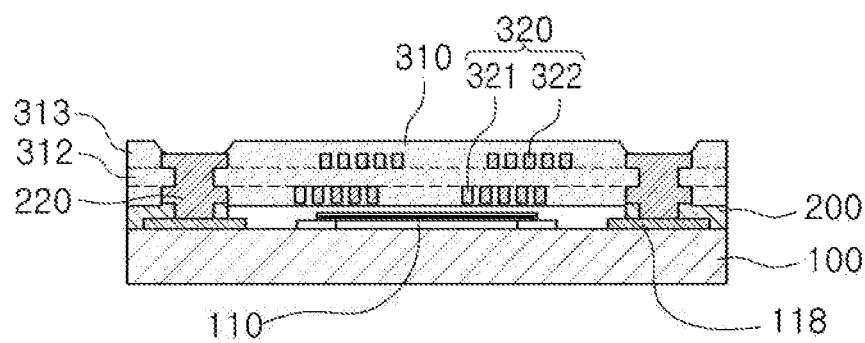
Figure 5:
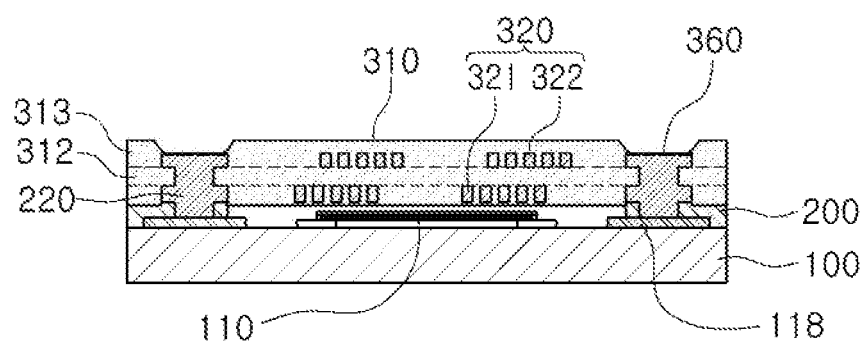

Next, as illustrated in FIG. 5, a third insulating layer 313 may be stacked on the second insulating layer 312 to embed the second inductor pattern 322 and the connection conductor 220 (S17).

Next, the connection conductor 220 may be exposed by removing a portion of the third insulating layer 313 (S18), and a surface treatment may be then performed for the exposed connection conductor 220 (S19). As the surface treatment, a process of forming a plating layer 360 may be performed, but the surface treatment is not limited thereto.

Next, the acoustic wave device illustrated in FIG. 1 may be completed by forming a connection terminal 500 on the exposed connection conductor 220.

Even though, in the present example, a method of forming up to the support portion 200 on the carrier substrate 10 and then transferring the support portion 200 to the substrate 100 is illustrated as an example, the configuration of the present disclosure is not limited thereto. Various modifications are possible. For example, after the support portion 200 is formed directly on the substrate 100 without forming the support portion 200 on the carrier substrate 10, the structure formed on the carrier substrate 10 may be transferred onto the support portion 200 of the substrate 100.

In addition, in the present example, the first inductor pattern 321 is formed on the carrier substrate 10 and the second inductor pattern 322 is formed on the substrate 100, but the first and second inductor patterns are not limited thereto and may be variously modified. For example, both the first inductor pattern 321 and the second inductor pattern 322 may be formed on the carrier substrate 10 or may be formed on the substrate 100 as in an example to be described below.

Figure 6:
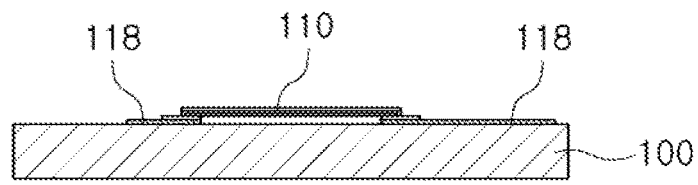
FIGS. 6 and 7 are views schematically illustrating another example of a method of manufacturing an acoustic wave device.
Figure 6:
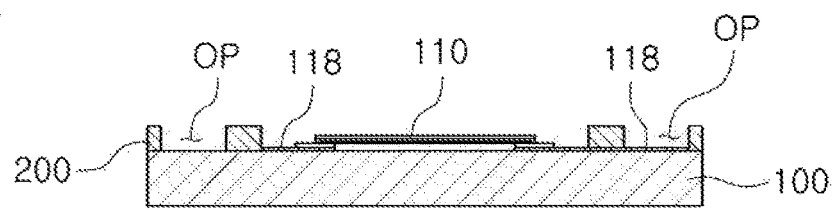
Figure 6:
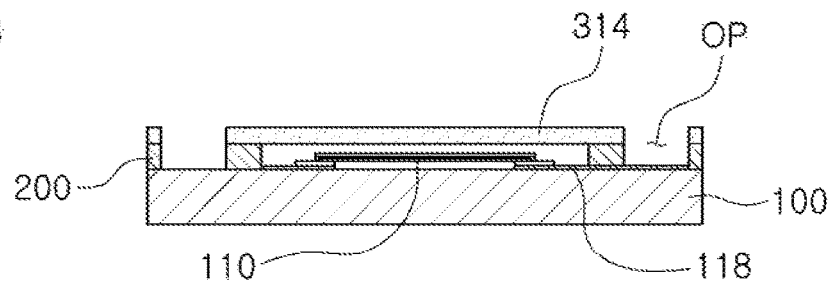
Figure 6:
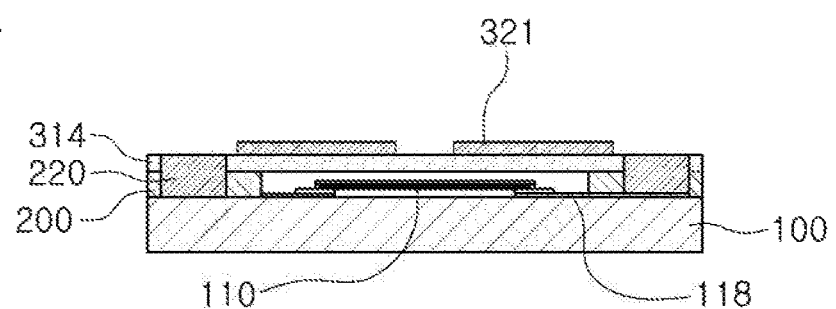
Figure 6:
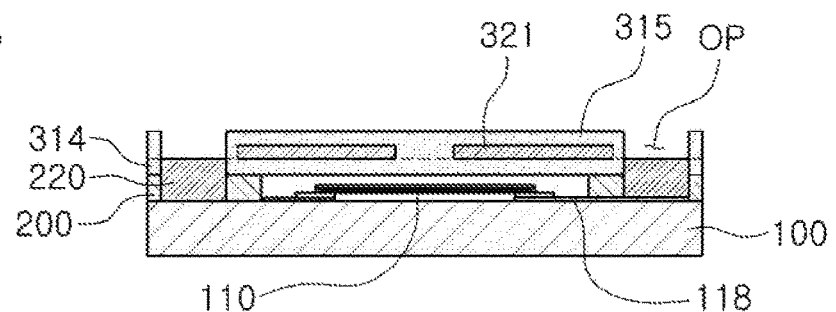
Figure 7:
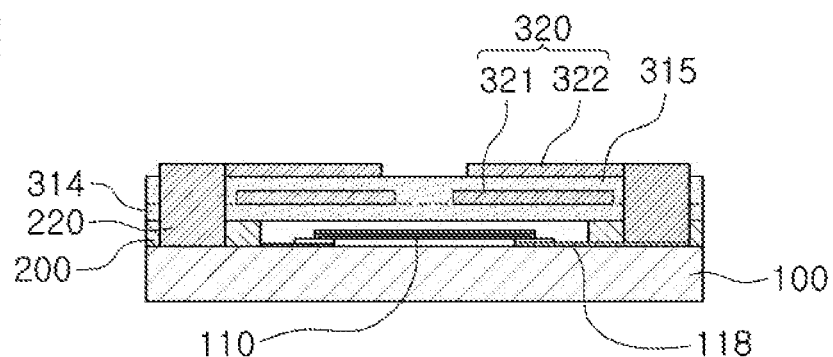
Figure 7:
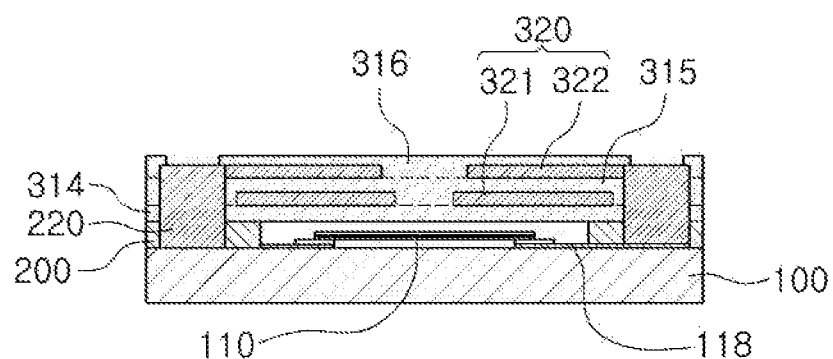
Figure 7:
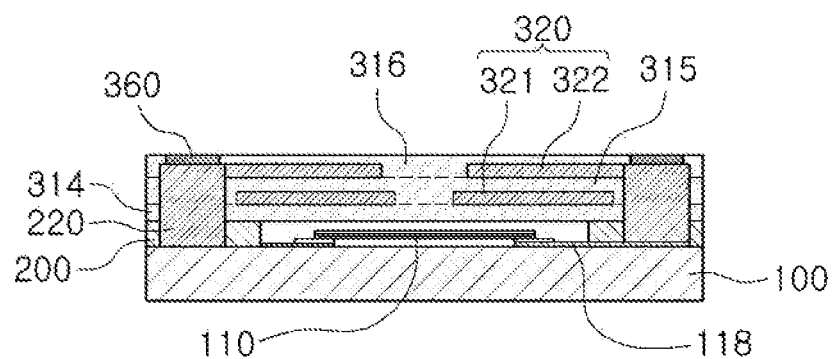
Figure 7:
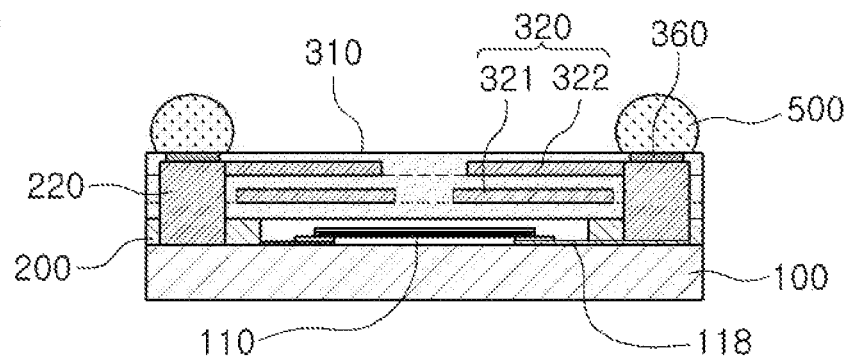

FIGS. 6 and 7 are views schematically illustrating a method of manufacturing an acoustic wave device according to another example in the present disclosure.

Referring to FIG. 6, in a method of manufacturing an acoustic wave device according to the present example, a substrate 100 on which an acoustic wave generator 110 and an electrode member 118 are formed may be first prepared (S001).

Next, a support portion 200 may be disposed on the substrate 100 (S002). In this case, at least one opening OP exposing the electrode member 118 may be formed in the support portion 200.

Next, a first inductor pattern 321 and a second inductor pattern 322 may be sequentially formed on an insulating layer by a photolithography method.

First, after a first insulating layer 314 is disposed on the support portion 200, the opening OP may be opened by partially removing the first insulating layer 314 (S003).

The first insulating layer 314 may be separately manufactured in a form of a flat insulating plate and may be then stacked on the support portion 200. Accordingly, the first insulating layer 314 may be coupled to the support portion 200 to fully cover the acoustic wave generator 110 over the acoustic wave generator 110.

Next, the first inductor pattern 321 may be formed on the first insulating layer 314 (S004). In this process, a connection conductor 220 may also be formed together by filling a conductive material in the opening OP. The present operation may be performed by forming a pattern using a mask layer (not shown) and then disposing the conductive material in the pattern, but is not limited thereto.

Next, the first inductor pattern 321 may be embedded by stacking a second insulating layer 315 on the first inductor pattern 321 (S005).

Next, the second inductor pattern 322 may be formed on the second insulating layer 315 (S006).

During the process of forming the second inductor pattern 322, a process of forming the connection conductor 220 by filling the conductive material in the opening OP of the second insulating layer 315 may be performed together. The present operation may be performed by forming a pattern using a mask layer (not shown) and then disposing the conductive material in the pattern. However, the present operation is not limited thereto.

Next, the second inductor pattern 322 may be fully embedded by stacking a third insulating layer 316 on the second inductor pattern 322 (S007). In addition, the connection conductor 220 may be partially exposed by partially removing the third insulating layer 316.

Thereafter, a plating layer 360 may be formed by performing a surface treatment for a surface of the exposed connection conductor 220 (S008), and the acoustic wave device may be completed by forming a connection terminal 500 on the plating layer 360 (S009).

Figure 8:
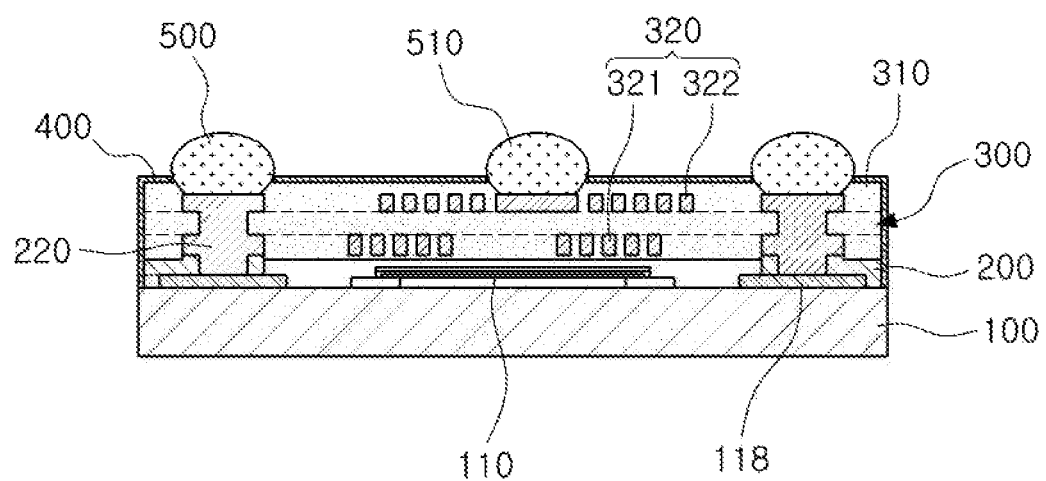
FIG. 8 is a cross-sectional view schematically illustrating another example of an acoustic wave device.

FIG. 8 is a cross-sectional view schematically illustrating an acoustic wave device according to another example in the present disclosure.

Referring to FIG. 8, the acoustic wave device according to the present example may include at least one supporting terminal 510.

The supporting terminal 510 may be disposed on the protective member 300, like the connection terminals 500, but may not be electrically connected to the connection conductor 220 or the substrate 110 and may be formed in a form of a dummy terminal. However, the supporting terminal 510 may also be electrically connected to a ground of the substrate 100 as needed.

The supporting terminal 510 may be formed of the same material as the connection terminal. For example, the supporting terminal 510 may be formed in a form of a solder ball, a solder bump, or the like, and a copper (Cu) pillar, a tin (Sn) pillar, and the like may also be used in some cases. However, the supporting terminal 510 is not limited thereto.

In the acoustic wave device, according to the present example, since the protective member 300 is formed of the resin material, rigidity of the protective member 300 may be insufficient. For example, in a case in which the acoustic wave device is mounted on the main board (or the package board) and the acoustic wave device is then encapsulated, the protective member 300 may be damaged by pressure applied by an encapsulant.

Therefore, the acoustic wave device according to the present example may include the supporting terminal 510 to compensate for the insufficient rigidity of the protective member 300.

In addition, in a case in which there is no supporting terminal 510, deformation of the protective member 300 due to pressure may increase toward the center of the protective member. Therefore, the supporting terminal 510 according to the present example may be disposed in a region corresponding to a region in which the acoustic wave generator 110 is formed.

Since such a supporting terminal 510 is disposed between a main board (not shown) and the protective member 300, and is bonded to the main board when the acoustic wave device is mounted on the main board, the protective member 300 may be supported and a movement thereof may be fixed by the supporting terminal 510.

Therefore, the supporting terminal 510 may prevent the protective member 300 from being deformed or damaged due to molding internal pressure.

In addition, the acoustic wave device according to the present example may include an airtight film 400.

The outer surfaces of the protective member 300 and the support portion 200 may be encapsulated by the airtight film 400.

The airtight film 400 may be disposed along the surfaces of the protective member 300 and the support portion 200, and may prevent moisture and foreign materials from entering a space between the protective member 300 and the support portion 200.

According to the present example, the airtight film 400 may be disposed only the outer surfaces of the protective member 300 and the support portion 200. However, the airtight film 400 is not limited thereto and may be modified as needed. For example, the airtight film 400 may also be formed on an outer surface of the substrate 100 to be extended.

Although the present example illustrates an example in which the airtight film 400 is formed along the outer surface of the protective member 300, the airtight film 400 may also be formed in the insulating member 310 of the protective member 300 as needed. For example, the airtight film 400 may be formed between the first inductor pattern 321 and the second inductor pattern 322 (i.e., on the second insulating layer), or may also be formed on a surface facing the acoustic wave generator.

Such an airtight film 400 may be formed of an inorganic insulating film or a thin film. For example, the airtight film 400 according to the present example may be formed of any one or any combination of any two or more of silicon nitride ($Si_xN_y$), silicon dioxide ($SiO_2$), silicon oxy-nitride ($SiO_xN_y$), silicon carbide (SiC), aluminum nitride (AlN), and alumina ($Al_2O_3$), and may be formed in a single layer or a multiple layers. However, a material of the airtight film 400 is not limited to the above-mentioned materials.

The airtight film 400 may be formed by a chemical deposition method, and may be formed, for example, by plasma enhanced chemical vapor deposition (PECVD). However, the method of forming the airtight film 400 is not limited thereto.

While, according to the present example, the acoustic wave device is configured to include both the supporting terminal 510 and the airtight film 400, the acoustic wave device is not limited thereto, and may also include any one of the supporting terminal 510 and the airtight film 400.

The acoustic wave device according to the present example as described above may have the passive element such as the inductor which is disposed in the protective member, and not in the substrate. In the acoustic wave devices according to the related art, the passive elements are formed in the substrate, or are provided as separate components and are mounted on the substrate. In this case, there is a problem that a thickness of the substrate increases or an entire area of the acoustic wave device increases.

However, since the acoustic wave device according to the present example has the inductor disposed in the protective member, the thickness of the substrate may be significantly reduced, and an area or a size of the acoustic wave device may be significantly reduced.

For example, according to the present disclosure, the element embedded in the insulating member of the acoustic wave device is not limited to the inductor pattern. The element embedded in the insulating member may be any one of various passive elements, and may include, for example, a capacitor or a resistor. In addition, various modifications are possible. For example, the inductor, the capacitor, and the resistor may be combined with each other to be disposed in the insulating member in a complex manner.

As set forth above, according to the examples in the present disclosure, the acoustic wave device may have the passive element such as the inductor which is disposed in the protective member, not in the substrate. Therefore, the area or the size of the acoustic wave device may be significantly reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic wave device comprising:
   an acoustic wave generator disposed on a surface of a substrate;
   a support portion disposed on the substrate along a circumference of the acoustic wave generator so that the support portion does not face a surface of the acoustic wave generator facing away from the substrate;
   a protective member coupled to the support portion so that the protective member directly faces the surface of the acoustic wave generator facing away from the substrate and is spaced apart from the surface of the acoustic wave generator facing away from the substrate by an interval; and
   at least one element embedded in the protective member.

2. The acoustic wave device of claim 1, wherein the protective member comprises a substrate covering the surface of the acoustic wave generator facing away from the substrate.

3. The acoustic wave device of claim 1, wherein the protective member comprises an insulating member, and the at least one element comprises an inductor pattern embedded in the insulating member.

4. The acoustic wave device of claim 3, further comprising a connection conductor penetrating through the support portion and the protective member,
   wherein the inductor pattern is electrically connected to the acoustic wave generator through the connection conductor.

5. The acoustic wave device of claim 4, wherein the connection conductor comprises one end connected to the substrate and another end coupled to a connection terminal.

6. The acoustic wave device of claim 1, further comprising:
- a plurality of connection terminals disposed on an outer surface of the protective member and electrically connecting the substrate and a main board to each other; and
- at least one supporting terminal disposed between the main board and the protective member to support the protective member.

7. The acoustic wave device of claim 6, wherein the supporting terminal and the connection terminals are made of a same material, and the supporting terminal and the connection terminals are coupled to the main board.

8. The acoustic wave device of claim 6, wherein the supporting terminal is a dummy terminal that is not electrically connected to the substrate.

9. The acoustic wave device of claim 6, wherein the supporting terminal is disposed in a region corresponding to a region in which the acoustic wave generator is formed.

10. The acoustic wave device of claim 1, further comprising an airtight film disposed along surfaces of the protective member and the support portion, and configured to prevent either one or both of moisture and foreign materials from entering the acoustic wave generator.

11. The acoustic wave device of claim 10, wherein the airtight film is made of an inorganic insulating film or a thin film.

12. An acoustic wave device comprising:
- an acoustic wave generator disposed on a surface of a substrate;
- a support portion disposed on the substrate along a circumference of the acoustic wave generator so that the support portion does not face a surface of the acoustic wave generator facing away from the substrate;
- a first insulating layer coupled to the support portion so that the first insulating layer directly faces the surface of the acoustic wave generator facing away from the substrate and is spaced apart from the surface of the acoustic wave generator facing away from the substrate;
- a first element embedded in the first insulating layer;
- a second insulating layer disposed on the first insulating layer; and
- a second element embedded in the second insulating layer.

13. The acoustic wave device of claim 12, wherein either one or both of the first element and the second element comprises an inductor pattern.

14. The acoustic wave device of claim 13, further comprising a connection conductor penetrating through the support portion, the first insulating layer, and the second insulating layer,
- wherein the inductor pattern is electrically connected to the acoustic wave generator through the connection conductor.

15. The acoustic wave device of claim 14, wherein the connection conductor comprises one end connected to the substrate and another end coupled to a connection terminal.

* * * * *